United States Patent
Bungo et al.

(10) Patent No.: US 10,976,110 B2
(45) Date of Patent: Apr. 13, 2021

(54) PLATE LAMINATE TYPE HEAT EXCHANGER

(71) Applicant: T.RAD Co., Ltd., Tokyo (JP)

(72) Inventors: Takuya Bungo, Tokyo (JP); Atsushi Okubo, Tokyo (JP); Taiji Sakai, Tokyo (JP)

(73) Assignee: T.Rad Co., Ltd., Tokyo (JP)

( * ) Notice: Subject to any disclaimer, the term of this patent is extended or adjusted under 35 U.S.C. 154(b) by 123 days.

(21) Appl. No.: 16/080,446

(22) PCT Filed: Mar. 13, 2017

(86) PCT No.: PCT/JP2017/011074
§ 371 (c)(1),
(2) Date: Aug. 28, 2018

(87) PCT Pub. No.: WO2017/159880
PCT Pub. Date: Sep. 21, 2017

(65) Prior Publication Data
US 2019/0063847 A1   Feb. 28, 2019

(30) Foreign Application Priority Data
Mar. 14, 2016   (JP) .............................. JP2016-050004

(51) Int. Cl.
*F28D 9/02*   (2006.01)
*B23K 1/00*   (2006.01)
(Continued)

(52) U.S. Cl.
CPC .................. *F28D 9/02* (2013.01); *B23K 1/00* (2013.01); *B23K 3/00* (2013.01); *F28F 3/06* (2013.01);
(Continued)

(58) Field of Classification Search
CPC ...... F28F 3/06; F28F 3/08; F28F 3/086; F28F 21/089; B23K 1/00; B23K 3/00; H05K 7/20254
See application file for complete search history.

(56) References Cited

U.S. PATENT DOCUMENTS 3,231,017 A * 1/1966 Henderson ............. B21D 53/04
                                                165/166
4,377,025 A * 3/1983 Masai ..................... B23P 15/26
                                                248/324
(Continued)

FOREIGN PATENT DOCUMENTS

| JP | 57-90881 A | 6/1982 |
| JP | 3026315 B2 | 3/2000 |
| JP | 2014-74524 A | 4/2014 |

*Primary Examiner* — Jon T. Schermerhorn, Jr.
(74) *Attorney, Agent, or Firm* — Norris McLaughlin, P.A.

(57) ABSTRACT

To provide a plate laminate type heat exchanger that is capable to be temporarily fixed easily and surely before brazing assembly and can be fabricated with good accuracy. In a plate laminate type heat exchanger using a cladding material cladded with a brazing material, in each of laminated plates, a round hole penetrating in a laminate direction is formed; a thin and long fixing pin is inserted into the round hole so as to communicate each of plates; the fixing pin is fixed to the round hole by expansion of the outer diameter only at one end part in the longitudinal direction of the fixing pin; and each of plates is temporarily fixed integrally.

9 Claims, 10 Drawing Sheets

(51) Int. Cl.
*B23K 3/00* (2006.01)
*H05K 7/20* (2006.01)
*F28F 21/08* (2006.01)
*F28F 3/08* (2006.01)
*F28F 3/12* (2006.01)
*F28F 3/06* (2006.01)
*F28D 21/00* (2006.01)

(52) U.S. Cl.
CPC ................ *F28F 3/08* (2013.01); *F28F 3/086* (2013.01); *F28F 3/12* (2013.01); *F28F 21/089* (2013.01); *H05K 7/20254* (2013.01); *F28D 2021/0029* (2013.01)

(56) References Cited

U.S. PATENT DOCUMENTS

| | | | |
|---|---|---|---|
| 7,492,595 B2 * | 2/2009 | Yoshioka | ............. H01L 23/473 |
| | | | 165/46 |
| 9,278,332 B2 * | 3/2016 | Hoglund | ................ B01J 19/249 |
| 2002/0023737 A1 | 2/2002 | Hao | |
| 2008/0165500 A1 * | 7/2008 | Yoshioka | ................ H01S 5/024 |
| | | | 361/699 |
| 2013/0149218 A1 | 6/2013 | Hoglund et al. | |

* cited by examiner

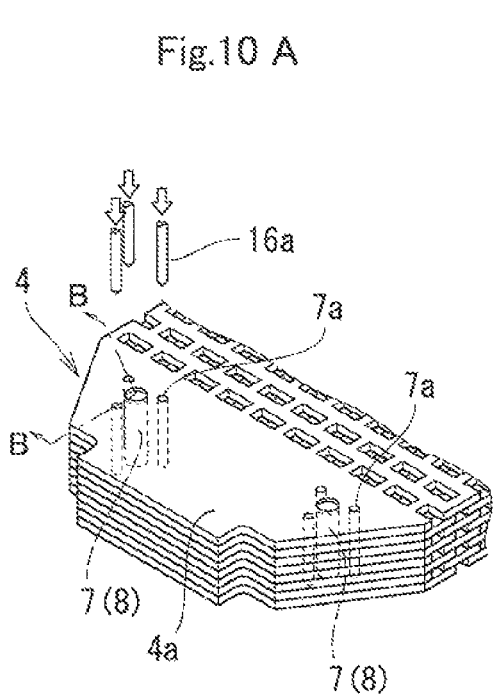
Fig.10 A
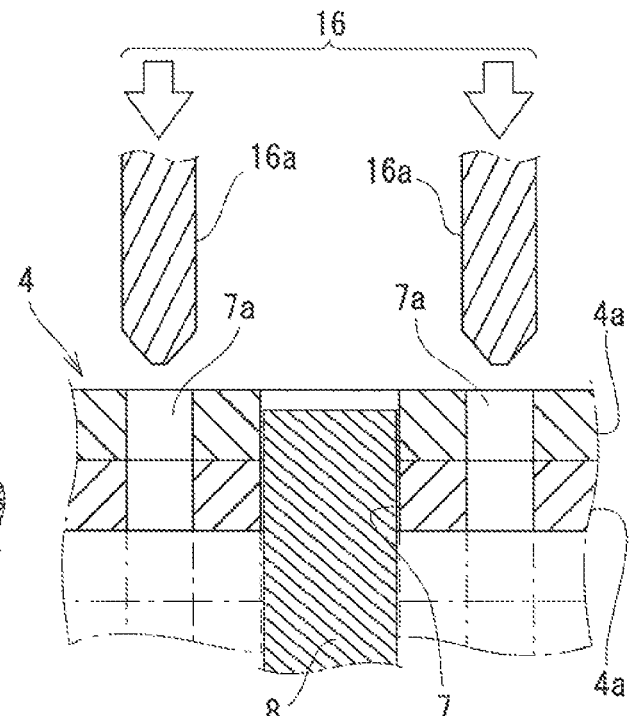
Fig.10 B
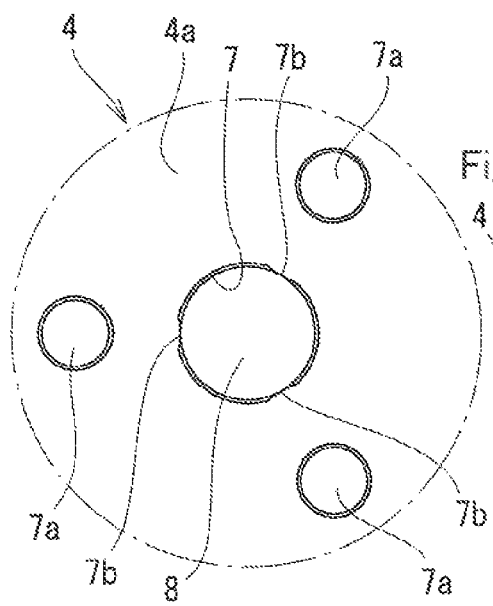
Fig.10 E
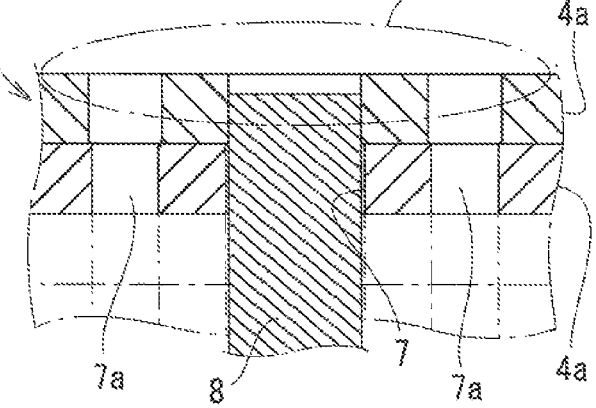
Fig.10 C
Fig.10 D

PLATE LAMINATE TYPE HEAT EXCHANGER

BACKGROUND OF THE INVENTION

The present invention relates to a plate laminate type heat exchanger applicable to a cooler and the like for cooling electronic devices such as an inverter.

Heretofore, as a plate laminate type heat exchanger applicable to a cooler for electronic devices such as an inverter and the like, there are known a cup plate type structure in which laminated inner plates are encompassed using a top plate or bottom plate in a cup shape, a complete laminate type structure in which plates having a circulation path therein are laminated and the top and bottom thereof are sealed with flat board-like plates, and the like.

With respect to these plate laminate type heat exchangers, generally the whole of a heat exchanger is integrally brazed and manufactured, but, in brazing, mutual plates such as inner plates needs to be laminated and temporarily fixed in a positioned state. As methods of temporary fixing, a method of welding an outer peripheral part of a laminated body, and a method by using a designated fixing jig are known. Of these, a method of welding an outer peripheral part causes such problems that the manufacturing process becomes considerably complex and welding marks remain also in a finished product.

On the other hand, as a general method that uses a designated fixing jig, there is a method in which a through hole for temporary fixing, in addition to a circulation hole for a fluid, is provided for each plate to be laminated, each plate is aligned into a lamination state prior to brazing, and, after that, a pin for fixing or the like is inserted into the through hole to perform temporary fixing. However, one obtained by simply inserting a pin for fixing or the like into the through hole in this way is in a so-called "loosely fitted state" and, therefore, displacement is generated frequently between each plate in a brazing process caused by vibration, external input power or the like, and there is an issue of securing structural accuracy in a plate laminate type heat exchanger after brazing. Furthermore, after the brazing, a process of removing the pin for fixing or the like becomes necessary.

As a method for solving the above-described problems, there is proposed a restraining system in which a plate and a pin for fixing are mutually fitted, for example, as disclosed in Patent Document 1. In Patent Document 1, it is a system in which a through hole for temporary fixing, in addition to a circulation hole for a fluid, is provided for each plate to be laminated, and a pipe having a function of a fixing pin is intruded into the through hole to thereby fit and restrain the whole, or a grooved spring pin having an outer diameter larger than the inner diameter of the through hole is inserted and the pin is subjected to diameter contraction to be fitted to thereby temporarily fix each of plates. Such restraining system can avoid displacement in brazing, which is a problem when temporary fixing is performed in the above-described "loosely fitted" state, and makes a removal process of a pin for fixing after brazing unnecessary.

SUMMARY OF INVENTION

However, in the case where the restraining system as disclosed in Japanese Patent No. 3026315 is adopted for improving a temporary fixing system in a "loosely fitted" state, a new problem is generated. That is, in a brazing process, there is generated decrease in dimension in the laminate direction due to melting and liquation of a brazing material, that is, a so-called "shrinkage by baking" phenomenon, and, on this occasion, if a pin for fixing or the like is wholly restrained, the shrinkage by baking is also restrained to cause poor joining between each plate, deterioration in flatness or the like.

Note that in Japanese Patent No. 3026315, there is also disclosed an example in which a grooved spring pin (a pipe with a groove in the axis direction) is used as a pin for fixing. In the case where a pin of this type is used, restraint in shrinkage by baking may be relieved, but a molten brazing material intrudes inside the pin from the groove part of the grooved spring pin in brazing, and therefore there are left other problems such that the "shrinkage by baking" phenomenon increases by the amount, the pin itself is an expensive part, and the like. Consequently, to solve these problems, the invention provides a following plate laminate type heat exchanger having a novel structure.

A first invention of the present invention is a plate laminate type heat exchanger obtained by laminating and fixing by brazing plural plates, wherein:

at least one of each of adjacent plates (A) is a cladding material cladded with a brazing material on a surface on the other side; and in each of laminated plates, a round hole penetrating in a laminate direction is formed, a thin and long fixing pin is inserted so as to communicate the round hole in each of plates, the fixing pin is expanded only in an outer diameter at one end part in a longitudinal direction thereof, and an outer periphery edge part expanded in diameter is fitted to an inner wall of the round hole.

A second invention of the present invention is a plate laminate type heat exchanger obtained by laminating and fixing by brazing plural plates, wherein:

at least one of each of adjacent plates (A) is a cladding material cladded with a brazing material on a surface on the other side;

in an outer peripheral part of each of the laminated plates (A), a cutout part (11) is formed, a thin and long fixing plate (12) is inserted so as to communicate the cutout part (11) of each of plates (A), the inserted fixing plate (12) is expanded in outer width only at one end part in a longitudinal direction thereof, and its outer periphery edge part thereof expanded in width is fixed to an inner wall of the cutout part (11).

A third invention of the present invention is a plate laminate type heat exchanger obtained by laminating and fixing by brazing plural plates, wherein:

at least one of each of adjacent plates (A) is a cladding material cladded with a brazing material on a surface on the other side;

in each of laminated plates (A), a round hole (7) penetrating in a laminate direction is formed, a thin and long fixing pin (8) is inserted so as to communicate the round hole (7) in each of plates, the round hole (7) is contracted in diameter in only one of an uppermost layer or a lowermost layer of laminated plates (A), and an inner periphery edge part thereof contracted in diameter is fitted to an outer peripheral part of the fixing pin (8).

In a fourth invention of the present invention, in the laminate state before brazing according to any one of above-described inventions, when total thickness of each of laminated plates (A) is denoted by T, total thickness of brazing material portions in the laminated plates is denoted by Ts, and each thickness of the two plates (A) at the uppermost layer and the lowermost layer is denoted by t, length L of the fixing pin (8) or the fixing plate (12) in a laminate direction falls in the range of $T-t \leq L < T-0.3\,Ts$.

In a fifth invention of the present invention, in a laminate state after brazing according to any one of above-described inventions, the fixing pin or the fixing plate is inserted in all the plates, and both end parts thereof lie inside outer surfaces of the plates at the uppermost layer and the lowermost layer.

In the first invention, in each of laminated plates, a round hole penetrating in a laminate direction is formed, a thin and long fixing pin is inserted so as to communicate the round hole in each of plates, the fixing pin is expanded only in an outer diameter at one end part in a longitudinal direction thereof, and its outer periphery edge part expanded in diameter is fitted to an inner wall of the round hole.

In a heat exchanger configured in this way, in a brazing process, each of laminated plates is temporarily fixed with a fixing pin and, therefore, displacement between each plate and the like is not generated. Moreover, only one end part of the fixing pin in the longitudinal direction is fixed to the round hole and, therefore, shrinkage by baking is not restrained in brazing. Hereby, it becomes possible to satisfy both temporary fixing of laminated plates and non-restraint of shrinkage by baking with a convenient and inexpensive method. As the result, an excellent heat exchanger, in which a complexity in the structure due to an addition of a complex part, poor joining between plates and deterioration in flatness do not exist, can be provided.

In the second invention of the present invention, in an outer peripheral part of each of the laminated plates, a cutout part is formed, a thin and long fixing plate is inserted so as to communicate the cutout part of each of plates, the inserted fixing plate is expanded in outer width only at one end part in a longitudinal direction thereof, and the outer periphery edge part thereof expanded in width is fixed to an inner wall of the cutout part.

In a heat exchanger configured in this way, in a brazing process, each of laminated plates is temporarily fixed with a fixing plate and, therefore, displacement between each plate and the like is not generated. Moreover, only one end part of the fixing plate in the longitudinal direction is expanded in width and, therefore, shrinkage by baking is not restrained in brazing. Hereby, it becomes possible to satisfy both temporary fixing of laminated plates and non-restraint of shrinkage by baking with a convenient and inexpensive method. As the result, an excellent heat exchanger, in which a complexity in the structure due to an addition of a complex part, poor joining between plates and deterioration in flatness do not exist, can be provided.

In the third invention of the present invention, in each of laminated plates, a round hole penetrating in a laminate direction is formed, a thin and long fixing pin is inserted so as to communicate the round hole in each of plates, the round hole is contracted in diameter only in one of an uppermost layer or a lowermost layer of laminated plates, and an inner periphery edge part thereof contracted in diameter is fitted to an outer peripheral part of the fixing pin.

In a heat exchanger configured in this way, in a brazing process, each of laminated plates is temporarily fixed with a fixing pin and, therefore, displacement between each plate and the like is not generated. Moreover, only one end part of the fixing pin in the longitudinal direction is fixed to a round hole and, therefore, shrinkage by baking is not restrained in brazing. Hereby, it becomes possible to satisfy both temporary fixing of laminated plates and non-restraint of shrinkage by baking, with a convenient and inexpensive method. As the result, an excellent heat exchanger, in which a complexity in the structure due to an addition of a complex part, poor joining between plates and deterioration in flatness do not exist, can be provided.

In a fourth invention of the present invention, in the laminate state before brazing according to any one of the above-described first invention to third invention, when the total thickness of each of laminated plates (A) is denoted by T, total thickness of brazing material portions in the laminated plates is denoted by Ts, and each thickness of the two plates (A) at the uppermost layer and the lowermost layer is denoted by t, length L of the fixing pin (8) or the fixing plate (12) in a laminate direction falls in a range of $T-t<L<T-0.3\ Ts$.

As a consequence of setting the length L of the fixing pin or the fixing plate so as to fall in the range of "$T-t<L$" in this way, the state where the fixing pin or the fixing plate is inserted into all the plates can be surely secured. Then, by an experiment, it has been confirmed that the total amount in shrinkage by baking in each of laminated plates in the laminate direction is approximately 0.3 Ts, and therefore by setting the length L of the fixing pin or the fixing plate to fall in the range of "$L<T-0.3\ Ts$," it is guaranteed that the fixing pin or the fixing plate does not project to the outside from the laminated plate, even after the plate has shrunk by baking due to brazing. As the result, a structurally excellent heat exchanger can be provided, in which poor joining between plates and deterioration in flatness due to shrinkage by baking do not exist, and a fixing pin or a fixing plate does not project to the outside of the plate.

In a fifth invention of the present invention, in a laminate state after brazing according to any one of the above-described first invention to third invention, the fixing pin or the fixing plate is inserted in all the plates, and both end parts thereof lie inside outer surfaces of the plate at the uppermost layer and the lowermost layer. When the configuration is as described above, a structurally excellent heat exchanger can be provided, in which poor joining between plates and deterioration in flatness due to shrinkage by baking do not exist, and a fixing pin or a fixing plate does not project to the outside of the plate.

BRIEF DESCRIPTION OF THE DRAWINGS

FIG. 10 illustrates a partial perspective view and a partially enlarged cross-sectional view of an insertion process of a diameter contraction pin before brazing of a heat exchanger in a fifth embodiment of the present invention.

DETAILED DESCRIPTION OF THE INVENTION

Figure 1:
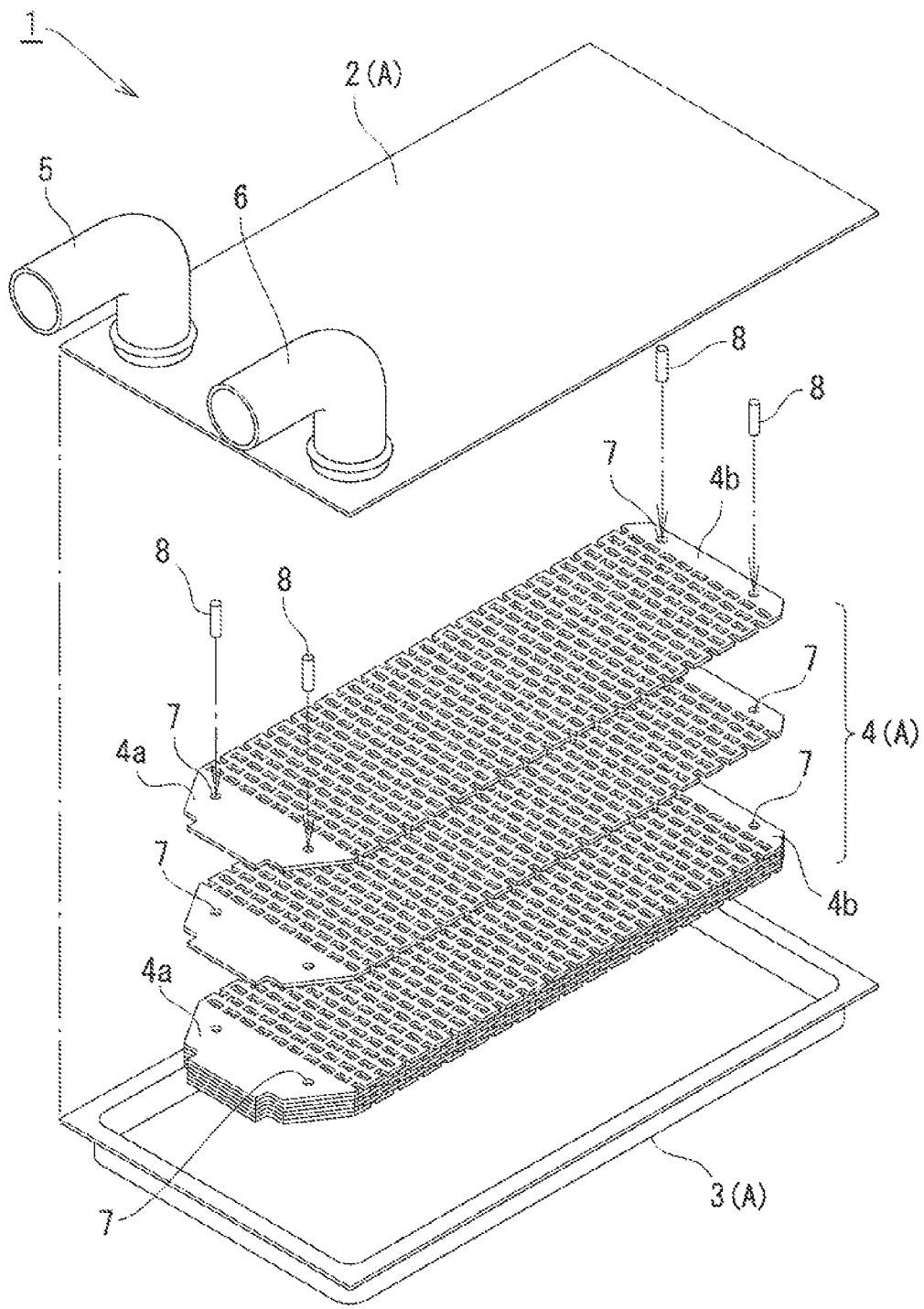
FIG. 1 illustrates an exploded perspective view before brazing of a heat exchanger in a first embodiment of the present invention.

FIG. 1 illustrates, in a cup plate type heat exchanger in a first embodiment of the present invention, an exploded perspective view before brazing of the heat exchanger. A heat exchanger 1 includes a top plate 2 on the upper side, a bottom plate 3 on the lower side, and plural inner plates 4 to be laminated therebetween, and, for the top plate 2, a fluid inlet pipe 5 for supplying a fluid such as cooling water and a fluid outlet pipe 6 for discharging the fluid are provided. The bottom plate 3 has a sidewall part on a peripheral part, and it is configured so that a flange formed on the upper part of the sidewall part and a peripheral part of the top plate 2 can be joined.

In the present invention, in the case where each of plates such as the top plate 2, the bottom plate 3 and the inner plate 4 is described all together, they are referred to generically as plates A. Note that these plates A are made of metal, and, generally, a plate material of an aluminum alloy or stainless steel is used as the metal material. Moreover, in the present invention, for at least one of mutually adjacent plates A, a cladding material in which the surface of the other side is cladded with a brazing material is used. With respect to a configuration of the plate A, for example, it is possible to use a cladding material whose both surfaces are cladded with a brazing material for the plate 4 as an intermediate layer, and to use a bare material for the plate 2 as the uppermost layer and for the plate 3 as the lowermost layer.

It is also possible to use a cladding material whose lower surface is cladded with a brazing material for the plate 2 as the uppermost layer and for the plate 4 as an intermediate layer, and to use a bare material for the plate 3 as the lowermost layer. Inversely, a bare material may be used for the plate 2 as the uppermost layer, and a cladding material whose upper surface is cladded with a brazing material may be used for the plate 4 as an intermediate layer and for the plate 3 as the lowermost layer. Note that, the configuration of a brazing material cladding in a cladding material can be chosen appropriately.

Each of the inner plates 4 having many circulation holes that allow a fluid to circulate has a thin and long plate-like shape, and, in two positions close to each of both end parts of one end part 4a and the other end part 4b, round holes 7 penetrate in the laminate direction (thickness direction), respectively. Note that it is configured such that, when each of the inner plates 4 is laminated so as to match with each other, each of the round holes 7 also matches coaxially with each other. Then the fixing pin 8 with length L is inserted into every round hole 7 in each inner plate 4.

Figure 2:
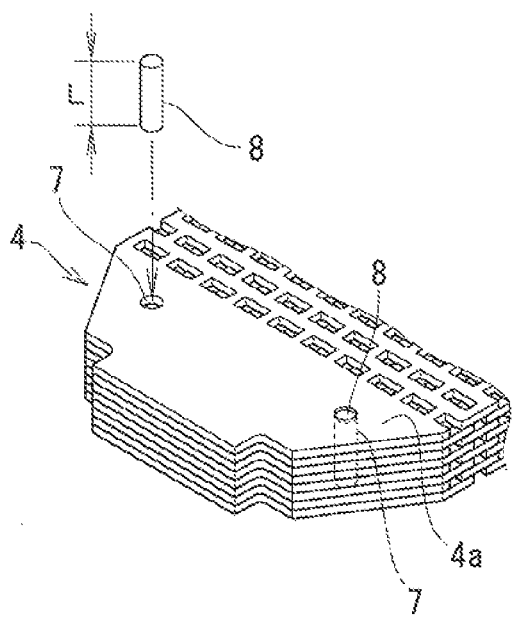
FIG. 2 illustrates a partial perspective view and a partial cross-sectional view showing an insertion process of a fixing pin before brazing of the heat exchanger in FIG. 1.
Figure 2:
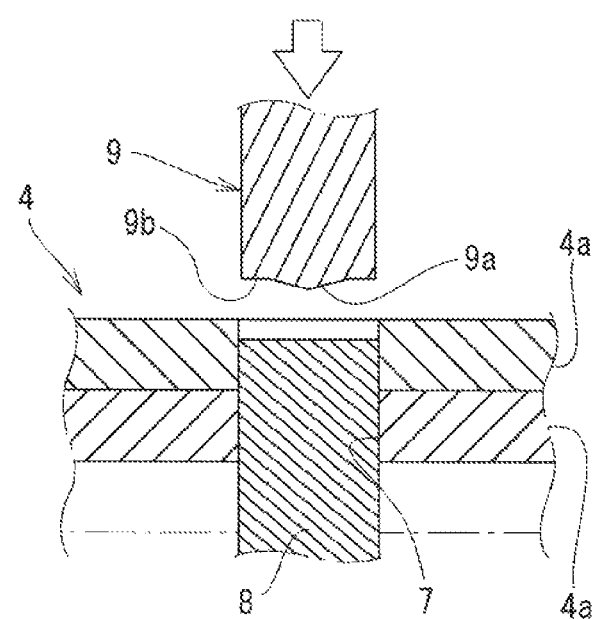
Figure 2:
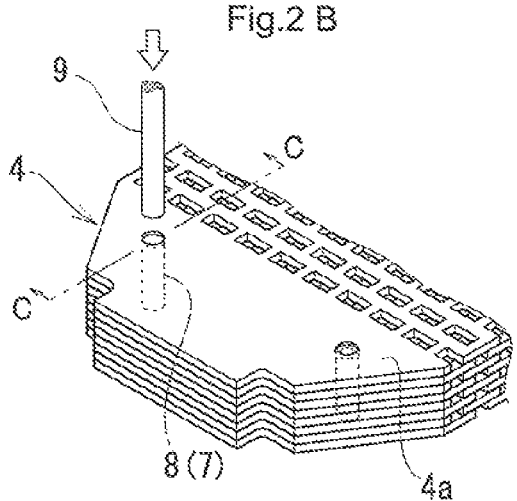
Figure 2:
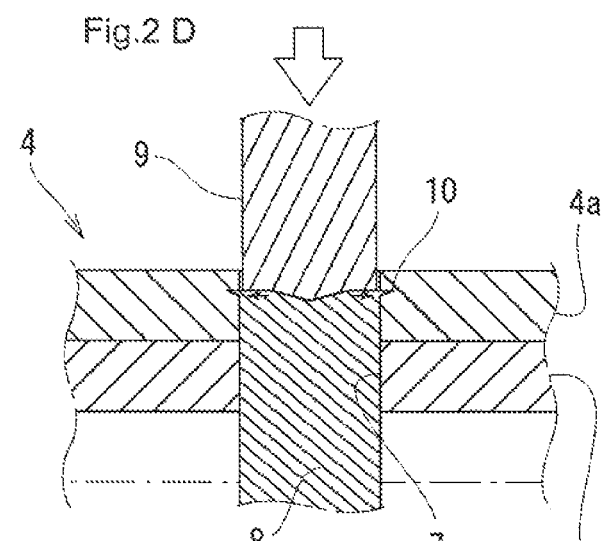
Figure 2:
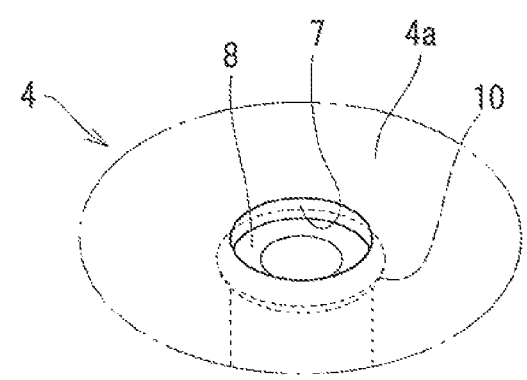
Figure 2:
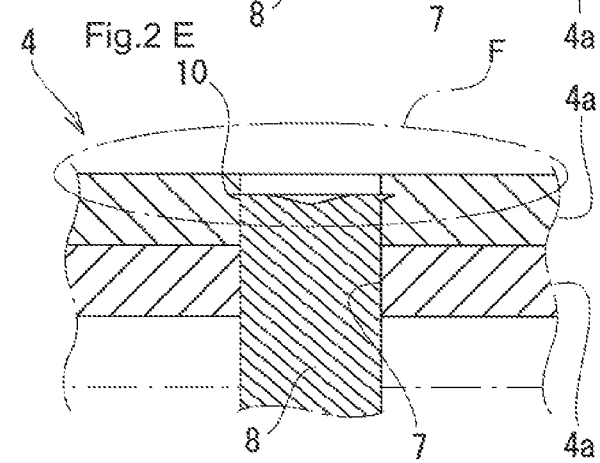

FIG. 2 illustrates a view showing a process before brazing of the heat exchanger in FIG. 1. FIG. 2(A) is a partial perspective view showing a state where the fixing pin 8 is going to be inserted into the round hole 7 formed in laminated plural inner plates 4, FIG. 2(B) is a partial perspective view showing a state where a diameter of the inserted fixing pin 8 at one end part in the longitudinal direction is being expanded with a thin and long diameter expansion tool 9 having a circular cross-section, FIG. 2(C) is a partial cross-sectional view showing a state before expansion of a diameter at one end part in the longitudinal direction of the fixing pin 8 inserted into the round hole 7 in the inner plate 4, FIG. 2(D) is a partial cross-sectional view showing a state where a diameter of the inserted fixing pin 8 at one end part in the longitudinal direction in the inner plate 4 is being expanded, FIG. 2(E) is a partial cross-sectional view showing a state after expansion of a diameter at one end part in the longitudinal direction of the fixing pin 8 inserted into the round hole 7 in the inner plate, and FIG. 2(F) is a partial perspective view showing a dashed-dotted line F portion shown in FIG. 2(E). Note that FIG. 2 shows only a process with respect to one end part 4a of the inner plate 4 shown in FIG. 1, but the other end part 4b may be performed by the same process.

In FIG. 2, first, the fixing pin 8 is inserted into the round hole 7 in laminated plural inner plates 4 in such a way as in FIG. 2(A). Next, as shown in FIGS. 2(B), 2(C) and 2(D), a tip part of the diameter expansion tool 9 is pressed in an arrow direction to one end part in the longitudinal direction of the fixing pin 8. To the tip part of the diameter expansion tool 9, as shown in FIG. 2(C), a diameter expansion part 9a having a conical shape with a moderate inclination angle is formed in the center part, and, between the peripheral part of the diameter expansion part 9a and the peripheral part of the diameter expansion tool 9, a flat annular part 9b is formed.

When the tip part of the diameter expansion tool 9 is pressed to one end part in the longitudinal direction of the fixing pin 8, the end part in the fixing pin 8 is compressed in the axis direction with the diameter expansion part 9a of the diameter expansion tool 9 and, thereby, an area close to the surface of the tip part of the fixing pin 8 is expanded in diameter in an annular shape in the radius direction along the annular part 9b of the diameter expansion tool 9 and projects. An outer periphery edge part 10 that has projected in this way goes in, while pressing the inner wall part of the round hole 7, so as to break into the inside thereof. As the result, as shown in FIGS. 2(D) to 2(F), only one end part in the longitudinal direction of the fixing pin 8 is fixed to the inner wall of the round hole 7.

Note that the length L of the fixing pin 8 is set as follows. That is, in the laminated state of each of the inner plates 4 before brazing shown in FIG. 2, in the case where the total thickness of each of laminated plates (A) is denoted by T, the total thickness of a brazing material portion in the laminated plates is denoted by Ts, and each thickness of two inner plates 4 in the uppermost layer and the lowermost layer is denoted by t, the length of the fixing pin 8 (length in the laminate direction) L is set in a range of "T−t<L<T−0.3 Ts." Here, 0.3 Ts is a total amount of shrinkage by baking (the whole amount of shrinkage by baking in the laminate direction in laminated inner plates 4) having been confirmed by an experiment.

When the length L of the fixing pin 8 is set as described above, the fixing pin 8 after brazing can be inserted into all the laminated inner plates 4 without causing the end part thereof to project from the uppermost surface and the lowermost surface of the laminated inner plates 4 toward the outside.

Figure 3:
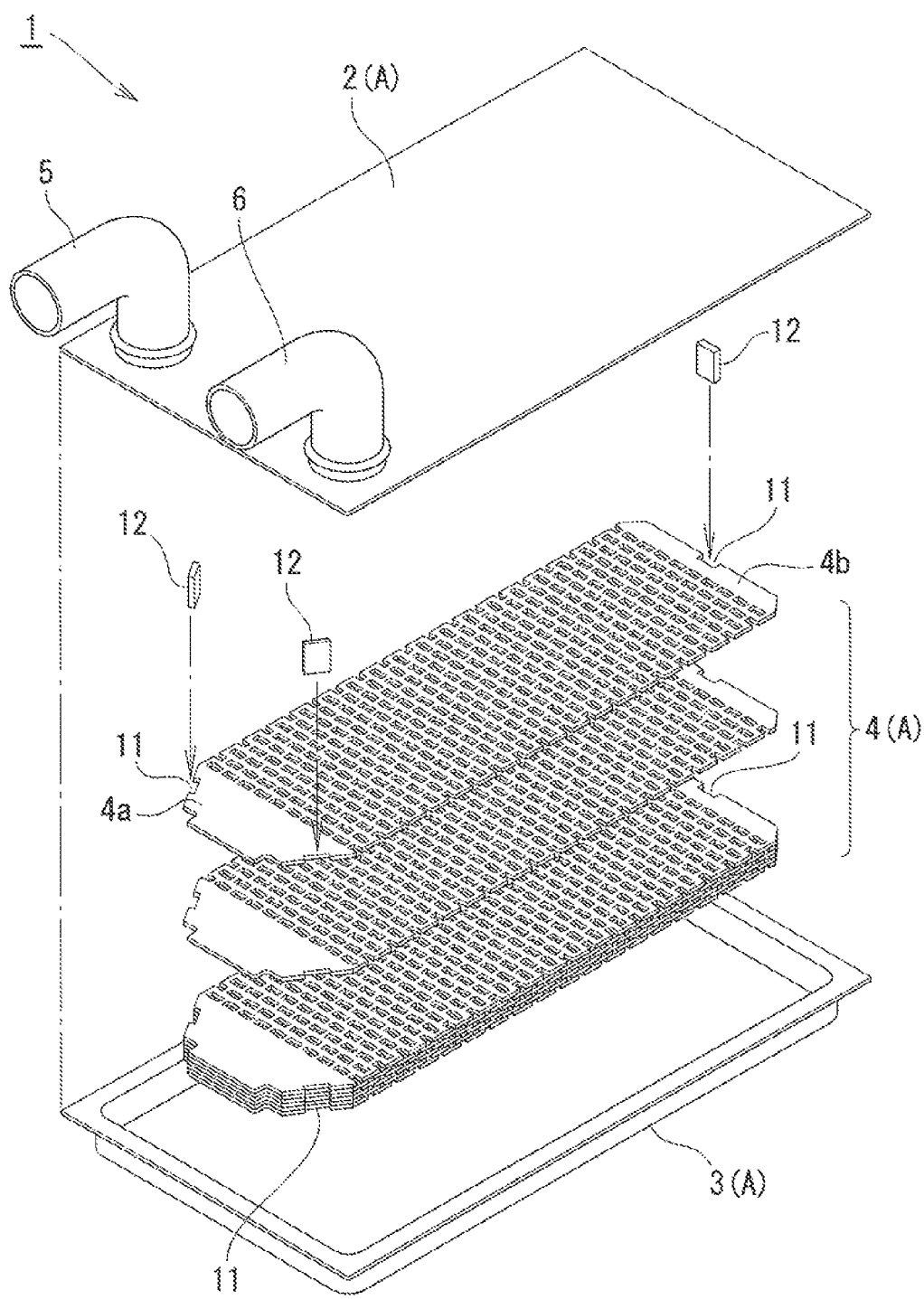
FIG. 3 illustrates an exploded perspective view before brazing of a heat exchanger in a second embodiment of the present invention.

FIG. 3 illustrates an exploded perspective view showing a state, in a cup plate type heat exchanger in the second embodiment of the present invention, before brazing of the heat exchanger. A different portion of the embodiment in FIG. 3 from the embodiment in FIG. 1 is only the fixing system of laminated inner plates, and the others are configured in the same way. Accordingly, the same reference sign is given to the same portion as in FIG. 1 and overlapping explanation will be omitted.

In the embodiment in FIG. 3, cutout parts 11 each having a square-shaped cross-section in the laminate direction are formed in two positions of the peripheral part at one end part 4*a* of each inner plate 4 and in one position of the peripheral part at the other end part 4*b*. Note that it is configured such that, when each inner plate 4 is laminated so as to match with each other, each cutout part 11 also matches coaxially with each other. Then, the fixing plate 12 is inserted into every cutout part 11 in each inner plate 4.

Figure 4:
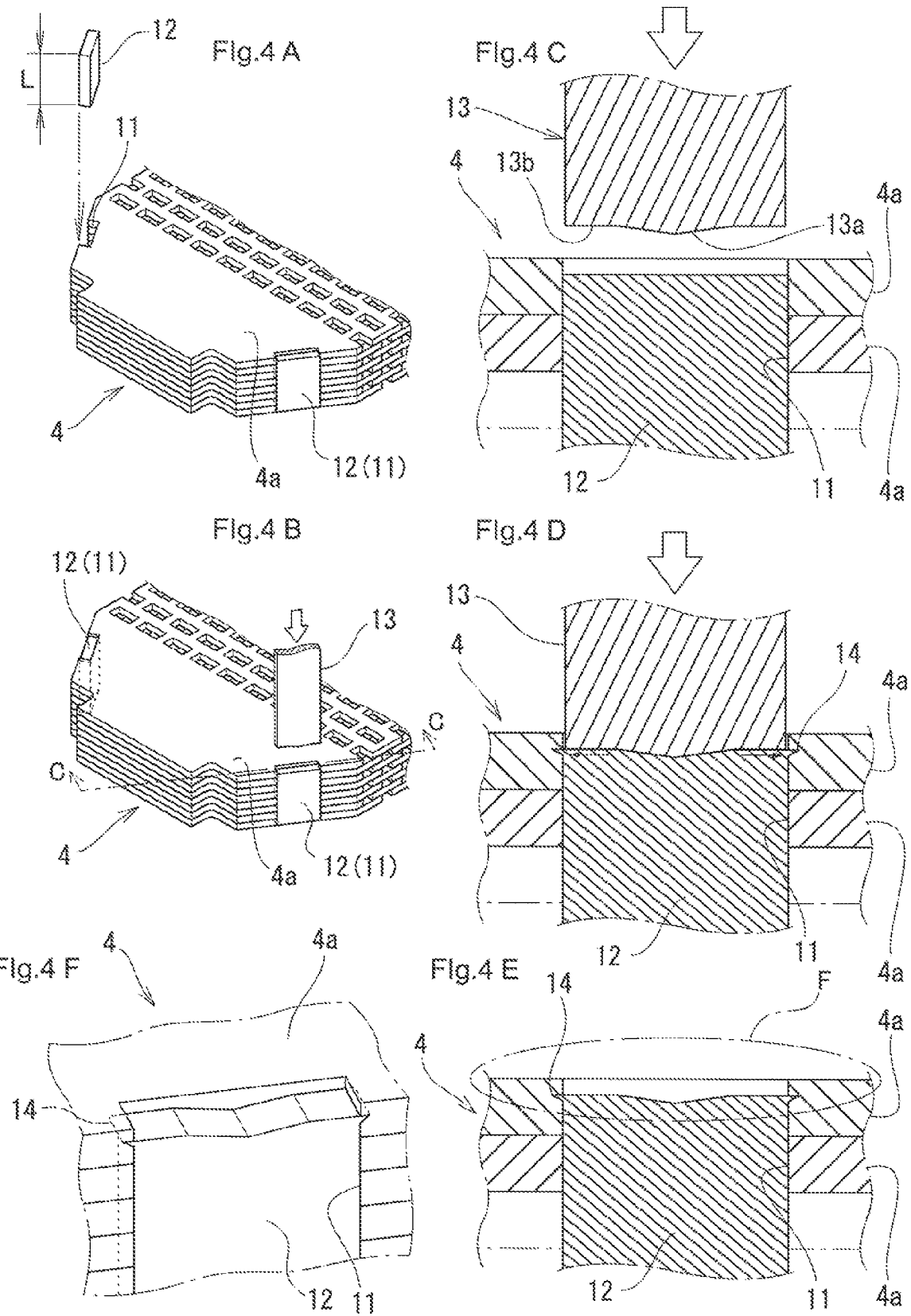
FIG. 4 illustrates a partial perspective view and a partial cross-sectional view showing an insertion process of a fixing plate before brazing of the heat exchanger in FIG. 3.

FIG. 4 illustrates a view showing a process before brazing of the heat exchanger in FIG. 3. FIG. 4(A) is a partial perspective view showing a state where the fixing plate 12 is being inserted into the cutout part 11 formed in laminated plural inner plates 4, FIG. 4(B) is a partial perspective view showing a state where width of one end part 4*a* in the longitudinal direction of the inserted fixing plate 12 is expanded with a thin and long width expansion tool 13 having a square-shaped cross-section, FIG. 4(C) is a partial cross-sectional view showing a state before width expansion of one end part in the longitudinal direction of the fixing plate 12 inserted into the cutout part 11 in the inner plate 4, FIG. 4(D) is a partial cross-sectional view showing a state where width of one end part in the longitudinal direction of the fixing plate 12 inserted into the cutout part 11 in the inner plate 4 is being expanded, FIG. 4(E) is a partial cross-sectional view showing a state after width expansion of one end part in the longitudinal direction of the fixing plate 12 inserted into the cutout part 11 in the inner plate 4, and FIG. 4(F) is a partial perspective view showing the dashed-dotted line F portion shown in FIG. 4(E).

In FIG. 4, first, the fixing plate 12 is inserted into the cutout part 11 in laminated plural inner plates 4 in such a way as in FIG. 4(A). Next, as shown in FIGS. 4(B), 4(C) and 4(D), a tip part of the width expansion tool 13 is pressed in an arrow direction to one end part in the longitudinal direction of the fixing plate 12. To the tip part of the width expansion tool 13 having a square cross-section, as shown in FIG. 4(C), a width expansion part 13*a* having a pyramid shape with a moderate inclination angle is formed in the center part, and, between two peripheral parts of the width expansion part 13*a* and the peripheral part of the width expansion tool 13, flat square parts 13*b* are formed, respectively.

When the tip part of the width expansion tool 13 is pressed to one end part in the longitudinal direction of the fixing plate 12, the end part of the fixing plate 12 is compressed in the axis direction with the width expansion part 13*a* of the width expansion tool 13, and thereby an area close to surface of the end part of the fixing plate 12 is expanded in a square shape in width directions along the square part 13*b* of the width expansion tool 13 and projects. An outer periphery edge part 14 expanded in a square shape to project goes in, while pressing the inner wall part of the cutout part 11, so as to break into the inside thereof. As the result, as shown in FIGS. 4(D) to 4(F), only one end part in the longitudinal direction of the fixing plate 12 is fixed to the inner wall of the cutout part 11.

Figure 5:
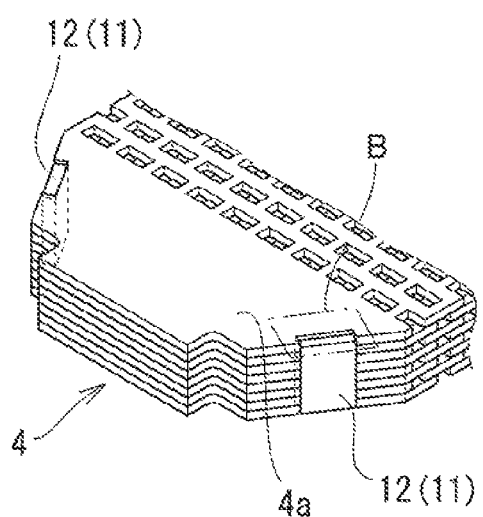
FIG. 5 illustrates a partial perspective view and a partially enlarged plan view showing a partially modified example of the heat exchanger in FIG. 3.
Figure 5:
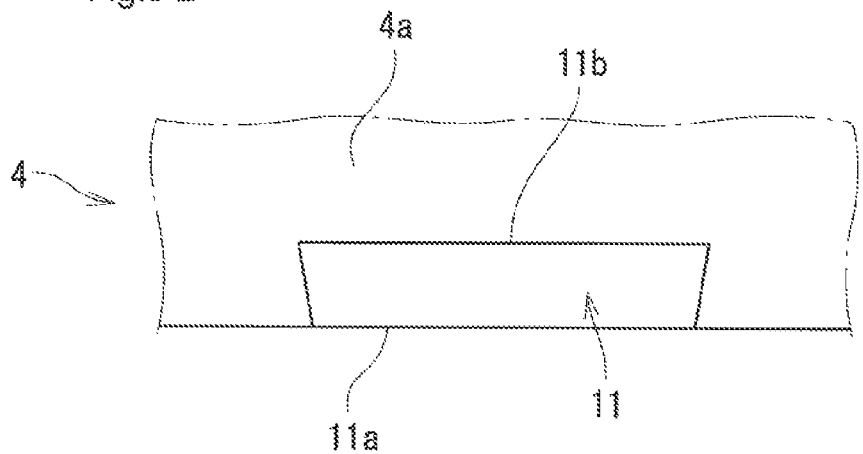

FIG. 5 illustrates a partially modified example of the heat exchanger in FIG. 3. FIG. 5(A) is a partial perspective view showing a portion of one end part 4*a* of the inner plate 4, and FIG. 5(B) is a partially enlarged plan view showing a B portion in FIG. 5(A). A different portion of the embodiment in FIG. 5 from the embodiment in FIG. 3 is only the cross-sectional shape in the laminate direction in the cutout part 11 formed in the peripheral part of one end part 4*a* (or the other end part 4*b*) of each inner plate 4, and the other portions are configured in the same way Although the cross-section in the laminate direction in the cutout part 11 shown in FIG. 3 is square, a cross-section in the laminate direction in the cutout part 11 shown in FIG. 5 is, as shown in FIG. 5(B), configured so as to have a trapezoidal shape in which both side surfaces extend linearly from an opening side 11*a* thereof toward a bottom surface 11*b* (so-called a dovetail cross-section). As a consequence of forming the cross-sectional shape of the cutout part 11 in the laminate direction into such a trapezoidal shape, when the fixing plate 12 is inserted into the cutout part 11, or is expanded with the width expansion tool 13, there is an effect of suppressing the fixing plate 12 from partially protruding toward the outside from the opening side 11*a* of the cutout part 11, to thereby make it possible to perform more easily and stably the insertion and width expansion operations of the fixing plate 12.

Figure 6:
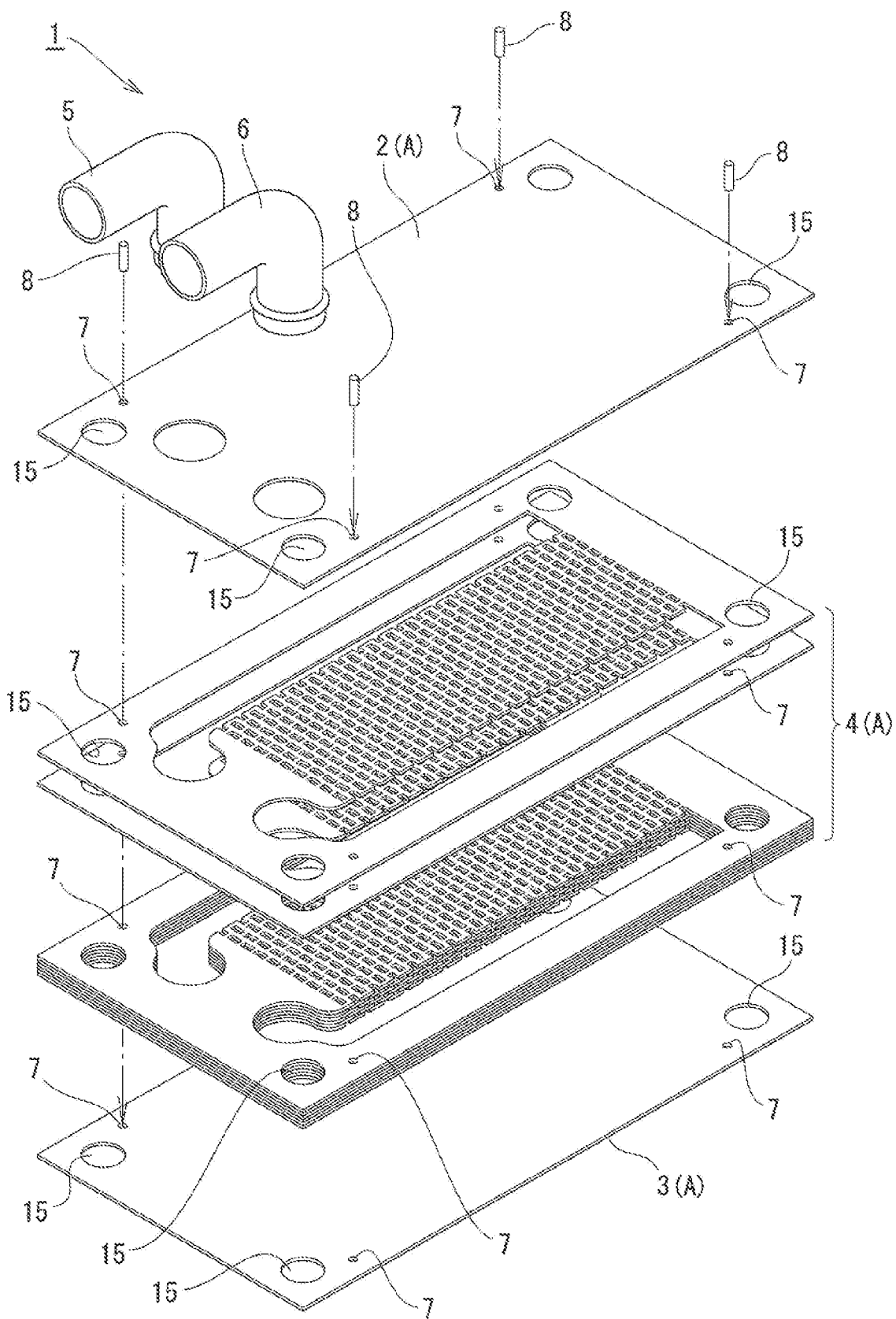
FIG. 6 illustrates an exploded perspective view before brazing of a heat exchanger in a third embodiment of the present invention.

FIG. 6 illustrates an exploded perspective view before brazing of a complete laminate type heat exchanger in the third embodiment of the present invention. Different points of the heat exchanger of the complete laminate type in FIG. 6 from the cup plate type heat exchanger in FIG. 1 are a mutual structural bonding form between the top plate 2, the bottom plate 3 and plural inner plates 4 to be laminated therebetween, the shape of peripheral part of each plate matching with the bonding form, and the like. However, the insertion form and fitting form between each plate and the fixing pin or the like, which are characteristic portions of the present invention, are configured in the same way. Accordingly, to the same portions in FIG. 1 and FIG. 6, the same reference sign as in FIG. 1 is given and an overlapping explanation will be omitted.

In FIG. 6, each of the top plate 2, the bottom plate 3 and plural inner plates 4 is formed in a square shape, and, at four corners of all the plates A, a bolt hole 15 for fixing the heat exchanger 1 to an object to be fixed is formed. Near four corners of all the plates A, respectively, the round hole 7 penetrates in the laminate direction (thickness direction). Note that it is configured such that, when each of inner plates 4 is laminated so as to match with each other, each of round holes 7 also matches coaxially with each other. Then, the thin and long fixing pin 8 is inserted into every round hole 7 in each of inner plates 4.

Figure 7A:
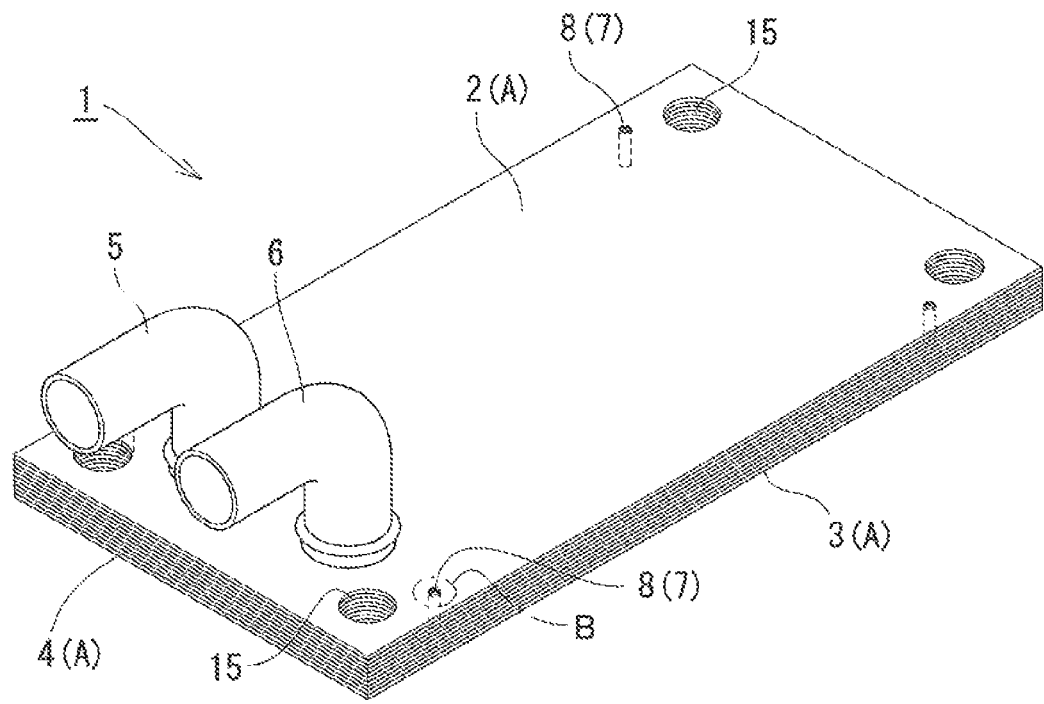
FIG. 7 illustrates a perspective view and a partially enlarged perspective view after brazing of the heat exchanger in FIG. 6.
Figure 7B:
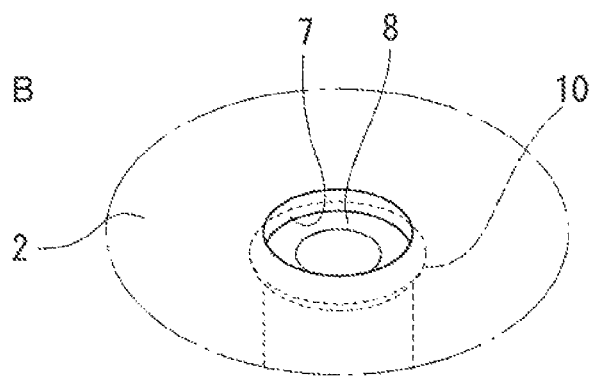

FIG. 7 illustrates a view showing a state after brazing of the heat exchanger in FIG. 6. FIG. 7(A) is a perspective view of the whole heat exchanger, and FIG. 7(B) is a partially enlarged perspective view of a dashed-dotted line B in FIG. 7(A). From the state in FIG. 6 and through a brazing process, the state in FIG. 7 is given. The process before the brazing is the same as the content explained in FIG. 2.

Figure 8:
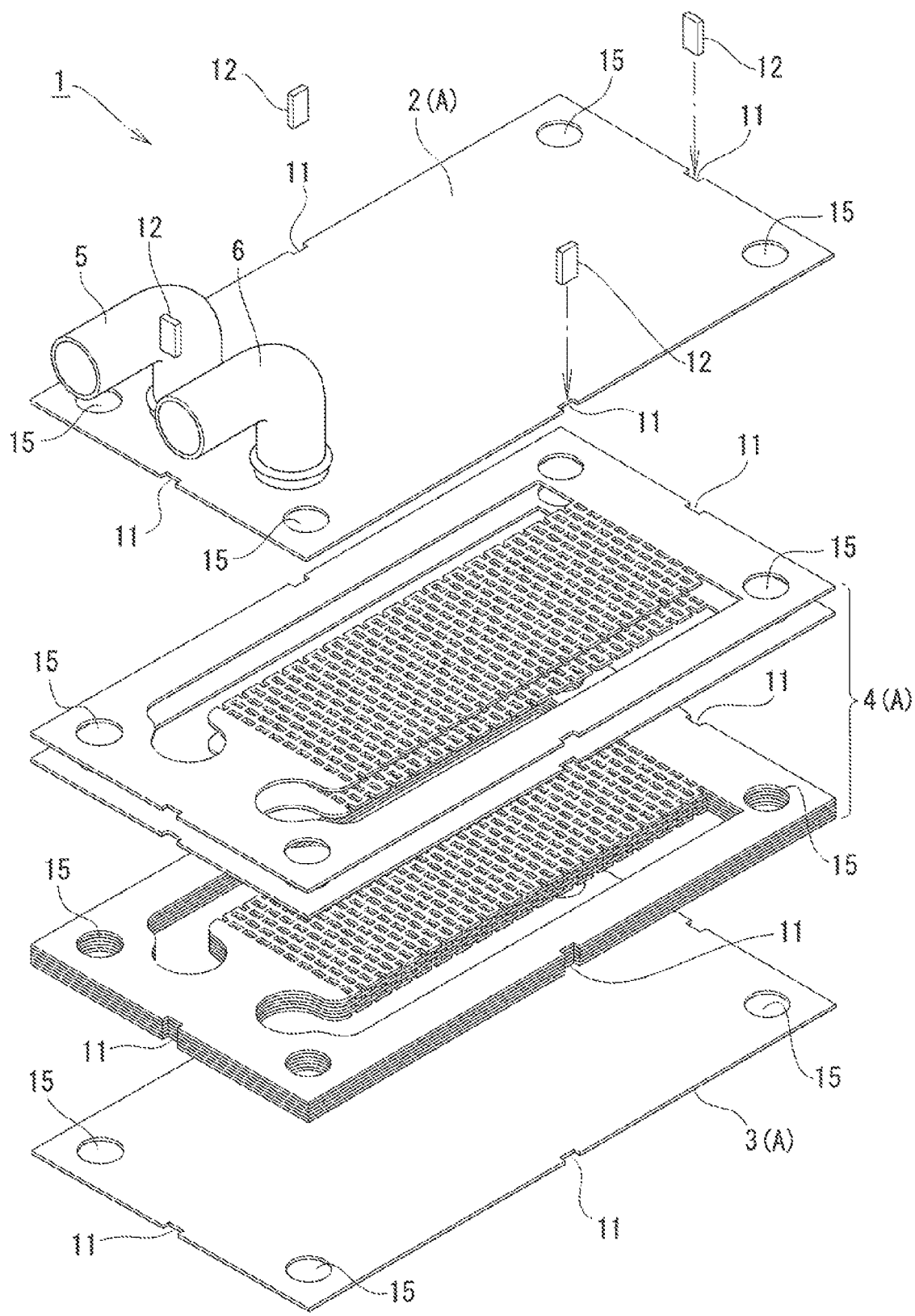
FIG. 8 illustrates an exploded perspective view before brazing of a heat exchanger in a fourth embodiment of the present invention.

FIG. 8 illustrates an exploded perspective view before brazing of a complete laminate type heat exchanger in the fourth embodiment of the present invention. A different portion of the embodiment in FIG. 8 from the embodiment in FIG. 6 is only a fixing system of laminated inner plates 4, and the others are configured in the same way. In other words, although the fixing system in FIG. 6 is the system based on the round hole 7 and fixing pin 8, which is the same as the fixing system in FIG. 1, the fixing system in FIG. 8 is the system based on the cutout part 11 and fixing plate 12, which is the same as the fixing system in FIG. 3.

Figure 9:
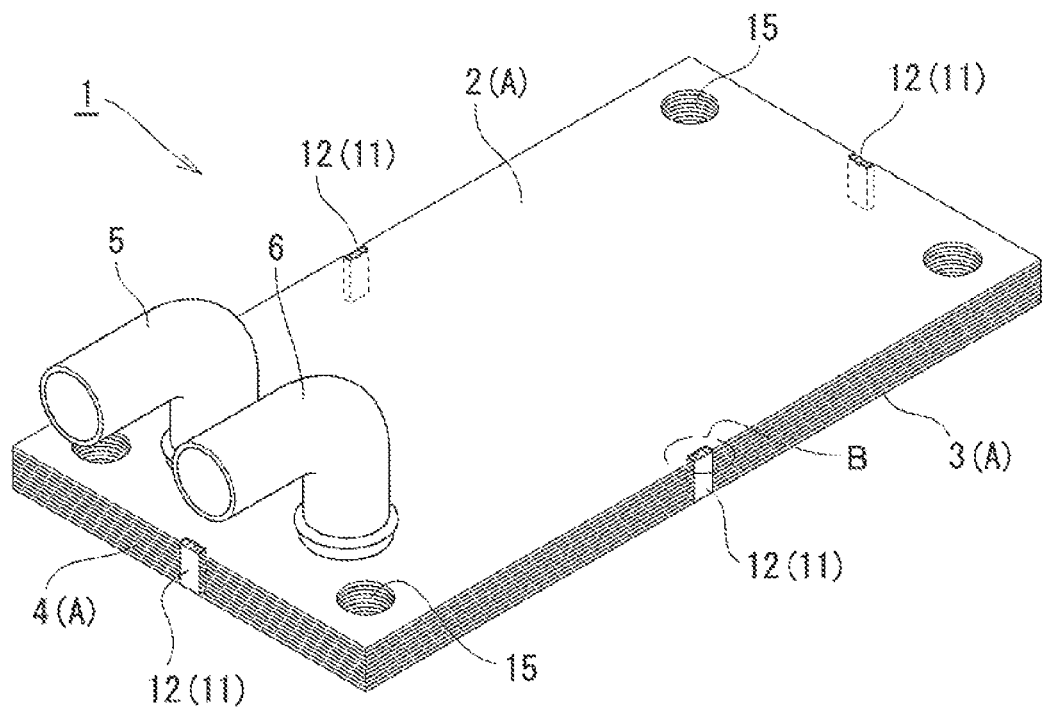
FIG. 9 illustrates a perspective view and a partially enlarged perspective view after brazing of the heat exchanger in FIG. 8.
Figure 9:
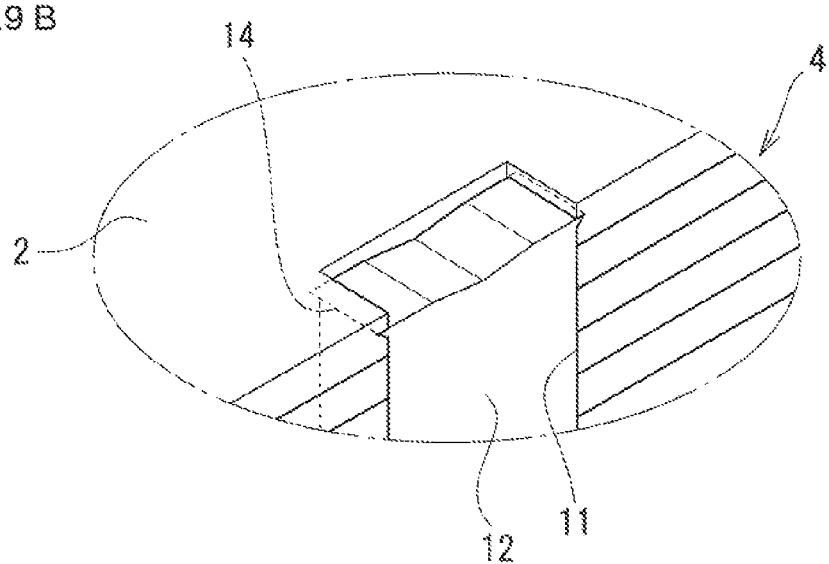

FIG. 9 illustrates a view showing a state after brazing of the heat exchanger in FIG. 8. FIG. 9(A) is a perspective view of the whole heat exchanger, and FIG. 9(B) is a partially enlarged perspective view of the dashed-dotted line B in FIG. 9(A). From the state in FIG. 8 and through a brazing process, the state in FIG. 9 is given. The process before the brazing is the same as the content explained in FIG. 4.

Note that as shown in FIG. 9(B), the shape of the tip part of the fixing plate 12 is a shape having been deformed due to the press with the width expansion tool 13 shown in FIG. 4, and the deformed shape has a state such that there has been transferred the shape of the tip part of the square width expansion tool 13, that is, the shape of the tip part in which the width expansion part 13*a* having a pyramid shape with a moderate inclination angle is formed in the center part and, a flat square part 13*b* is formed respectively between two peripheral parts of the width expansion part 13*a* and the peripheral part of the width expansion tool 13. Such a state where the shape of the tip part of the tool approximately coincides with the shape of the tip part of the fixing plate 12 is applied also to the tip part of the fixing pin 8 shown in FIG. 2(F).

FIG. 10 illustrates a view showing a process before brazing of a heat exchanger in the fifth embodiment of the present invention. The main body of the heat exchanger in FIG. 10 is similar to the main body of the heat exchanger 1 shown in FIG. 1, and a different portion from that in FIG. 1 is only the fixing system of laminated inner plates 4. Accordingly, the same reference sign is given to the same portion as in FIG. 1 and overlapping explanation will be omitted.

FIG. 10(A) is a partial perspective view showing a state where the fixing pin 8 is inserted into the round hole 7 formed in laminated plural inner plates 4, FIG. 10(B) is a partial cross-sectional view seen along a B-B arrow in FIG. 10(A), FIG. 10(C) is a partial cross-sectional view showing a state where a part of the inner diameter of the round hole 7 into which the fixing pin 8 has been inserted is being subjected to diameter contraction, FIG. 10(D) is a partial cross-sectional view showing a state after subjecting a part of the inner diameter of the round hole 7 into which the fixing pin 8 has been inserted to diameter contraction, and FIG. 10(E) is a partial plan view showing a portion of a dashed-dotted line E shown in FIG. 10(D). Note that the processes shown in FIG. 10 are shown with respect to only one end part 4*a* of the inner plate 4 as in the case for FIG. 2, but similar processes may also be performed for the other end part 4*b*.

As shown in FIG. 10(A), so as to enclose the peripheral part of plural round holes 7 formed in each inner plate 4, plural (three in this embodiment) through holes 7*a* are formed in the circumference direction thereof at even intervals. The inner diameter of each of through holes 7*a* having the identical diameter in the longitudinal direction is formed to be as small as approximately in a fraction of the inner diameter of the round hole 7, as illustrated.

In FIG. 10, first, as illustrated in FIG. 10(A) or 10(B), the fixing pin 8 is inserted into the round hole 7 in laminated plural inner plates 4. The inner diameter of the round hole 7 having an identical diameter in the length direction is set so as to allow the fixing pin 8 having an identical diameter in the length direction to be inserted smoothly with sliding. After inserting the fixing pin 8 into the round hole 7, as illustrated in FIG. 10(C), each diameter contraction pin 16*a* of a diameter contraction tool 16 is inserted with press from one end part of each through hole 7*a*. Diameter contraction pins 16*a* each having the identical diameter in the longitudinal direction are fixed in a plural number (three in this embodiment) to a fixing part (not illustrated) of the diameter contraction tool 16. Note that positions of respective diameter contraction pins 16*a* are arranged so as to match with positions of respective through holes 7*a*, and also the outer diameter thereof is set to be somewhat larger than the inner diameter of the through hole 7*a*.

When the diameter contraction pin 16*a* is inserted with press into each of three through holes 7*a*, each inner diameter of through holes 7*a* having been pressed in the radius direction is expanded, and thereby three positions of the inner diameter of the round hole 7 partially evaginate toward the inside. FIG. 10(E) shows three evagination parts 7*b* partially evaginating from three positions of the inner wall of the round hole 7 toward the inside. Each evagination part 7*b* causes a state where only one end part in the longitudinal direction of the fixing pin 8 is fixed to the round hole 7, and each of laminated inner plates 4 is mutually temporarily fixed stably.

Note that, to form the evagination part 7*b* efficiently and accurately, it is necessary to vary the thickness of a wall part between the through hole 7*a* and the round hole 7 surely and by a desired value by the press action of the diameter contraction pin 16*a*. The optimal thickness of the wall part varies depending on material quality of the wall part, and therefore it is desirably set on the basis of data of press experiment or the like.

The present invention is applied to a plate laminate type heat exchanger applicable to a cooler for cooling electronic devices such as an inverter.

The invention claimed is:

1. A plate laminate type heat exchanger obtained by laminating and fixing by brazing plural plates, wherein:
   at least one of each of adjacent plates is a cladding material cladded with a brazing material on a surface on the other side; and
   in each of laminated plates, a round hole penetrating in a laminate direction is formed, a thin and long fixing pin is inserted so as to communicate the round hole in each of plates, the fixing pin is expanded only in an outer diameter at one end part in a longitudinal direction thereof, and an outer periphery edge part expanded in diameter is fitted to an inner wall of the round hole.

2. The plate laminate type heat exchanger according to claim 1, wherein: when total thickness of each of laminated plates is denoted by T, total thickness of brazing material portions in the laminated plates is denoted by Ts, and each thickness of the two plates at the uppermost layer and the lowermost layer is denoted by t, length L of the fixing pin or the fixing plate in the laminate direction falls in a range of T−t<L<T−0.3 Ts.

3. The plate laminate type heat exchanger according to claim 1, wherein: the fixing pin or the fixing plate is inserted in all the plates, and both end parts thereof lie inside outer surfaces of the plates at the uppermost layer and the lowermost layer.

4. A plate laminate type heat exchanger obtained by laminating and fixing by brazing plural plates, wherein:
   at least one of each of adjacent plates is a cladding material cladded with a brazing material on a surface on the other side;
   in an outer peripheral part of each of the laminated plates, a cutout part is formed, a thin and long fixing plate is inserted so as to communicate the cutout part of each of plates, the inserted fixing plate is expanded in outer width only at one end part in a longitudinal direction thereof, and an outer periphery edge part thereof expanded in width is fixed to an inner wall of the cutout part.

5. The plate laminate type heat exchanger according to claim 4, wherein: when total thickness of each of laminated plates is denoted by T, total thickness of brazing material portions in the laminated plates is denoted by Ts, and each thickness of the two plates at the uppermost layer and the lowermost layer is denoted by t, length L of the fixing pin or the fixing plate in the laminate direction falls in a range of $T-t<L<T-0.3\ Ts$.

6. The plate laminate type heat exchanger according to claim 4, wherein: the fixing pin or the fixing plate is inserted in all the plates, and both end parts thereof lie inside outer surfaces of the plates at the uppermost layer and the lowermost layer.

7. A plate laminate type heat exchanger obtained by laminating and fixing by brazing plural plates, wherein:
   at least one of each of adjacent plates is a cladding material cladded with a brazing material on a surface on the other side;
   in each of laminated plates, a round hole penetrating in a laminate direction is formed, a thin and long fixing pin is inserted so as to communicate the round hole in each of plates, the round hole is contracted in diameter in only one of an uppermost layer or a lowermost layer of laminated plates, and an inner periphery edge part thereof contracted in diameter is fitted to an outer peripheral part of the fixing pin.

8. The plate laminate type heat exchanger according to claim 7, wherein: when total thickness of each of laminated plates is denoted by T, total thickness of brazing material portions in the laminated plates is denoted by Ts, and each thickness of the two plates at the uppermost layer and the lowermost layer is denoted by t, length L of the fixing pin or the fixing plate in the laminate direction falls in a range of $T-t<L<T-0.3\ Ts$.

9. The plate laminate type heat exchanger according to claim 7, wherein: the fixing pin or the fixing plate is inserted in all the plates, and both end parts thereof lie inside outer surfaces of the plates at the uppermost layer and the lowermost layer.

* * * * *